(12) United States Patent
Chiue et al.

(10) Patent No.: US 6,580,307 B1
(45) Date of Patent: Jun. 17, 2003

(54) LEVEL SHIFT CIRCUIT WITHOUT JUNCTION BREAKDOWN OF TRANSISTORS

(75) Inventors: Lung-I Chiue, Tao-Yuan (TW); Yen-Tai Lin, Hsin-Chu (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 10/064,257

(22) Filed: Jun. 26, 2002

(51) Int. Cl.[7] .......................................... H03K 19/0185
(52) U.S. Cl. ........................................ 327/333; 327/81
(58) Field of Search .......................... 327/333; 326/80, 326/81; 257/336, 344

(56) References Cited

U.S. PATENT DOCUMENTS

| | | | | |
|---|---|---|---|---|
| 5,136,190 A | * | 8/1992 | Chern et al. ................... | 326/81 |
| 5,969,542 A | * | 10/1999 | Maley et al. .................. | 326/81 |
| 6,040,708 A | * | 3/2000 | Blake et al. ................... | 326/81 |
| 6,064,227 A | * | 5/2000 | Saito ............................. | 326/80 |
| 6,177,824 B1 | * | 1/2001 | Amanai ....................... | 327/333 |
| 6,180,983 B1 | * | 1/2001 | Merrill ........................ | 257/347 |

OTHER PUBLICATIONS

Shimotsusa, US Patent Publication 2002/0,215,511 Sep. 12, 2002, Ser. No. 10/067,904 filed Feb. 8, 2002.*

* cited by examiner

Primary Examiner—Toan Tran
(74) Attorney, Agent, or Firm—Winston Hsu

(57) ABSTRACT

A level shift circuit for shifting an input voltage to an output voltage is provided. The level shift circuit includes at least a complementary metal oxide semiconductor (CMOS) transistor formed on a p-substrate. The CMOS transistor has a PMOS transistor and an NMOS transistor. The NMOS transistor includes a gate electrode, a drain electrode having an n-well formed on the p-substrate and a first n-doped region formed inside the n-well, and a source electrode having a second N-doped region formed on the p-substrate.

4 Claims, 6 Drawing Sheets

LEVEL SHIFT CIRCUIT WITHOUT JUNCTION BREAKDOWN OF TRANSISTORS

BACKGROUND OF INVENTION

1. Field of the Invention

The present invention relates to a level shift circuit, and more particularly, to a level shift circuit without junction breakdown transistors.

2. Description of the Prior Art

The quality of a gate oxide of a metal oxide semiconductor (MOS) transistor affects the characteristics of the MOS. For example, a charge disposition variation of the gate oxide of a transistor will change a threshold voltage Vt of the transistor. Moreover, the existing charge in the gate oxide also reduces a breakdown voltage of the transistor. Please refer to FIG. 1, which is a schematic diagram of a charge disposition of a prior art MOS transistor 10. The MOS transistor 10 comprises a metal layer (which serves as a gate electrode) 11, an oxide layer 12, and a substrate 13. In general, charges existing in the oxide layer 12 of a transistor are divided into four categories: interface trapped charges (Qit) 14, fixed oxide charges (Qf) 16, oxide trapped charges (Qot) 18, and mobile charges (Qm) 20. Most interface trapped charges 14 form at an intersection between the oxide layer 12 and the substrate 13, where a disposition of lattices is discontinuous. The discontinuity makes silicon-silicon bonds of the silicon atoms in the substrate 13 and silicon-oxide bonds of the Silica in the oxide layer 12 to break, consequently generating the interface trapped charges 14. Most fixed oxide charges 16 are disposed at an intersection between the oxide layer 12 and the substrate 13. The fixed oxide charges 16 are positive and will not disappear by a discharging process. The oxide trapped charges 18 are disposed evenly in the oxide layer 12 and exist because of defects of the oxide layer 12. The mobile charges 20 are mainly sodium ions and potassium ions, which are introduced in a MOS transistor manufacturing process and move freely within the oxide layer 12.

Please refer to FIG. 2, which is a schematic diagram of a structure of the MOS transistor 10 shown in FIG. 1. The MOS transistor 10 comprises an n-type metal oxide semiconductor (NMOS) transistor 22 and a p-type metal oxide semiconductor (PMOS) transistor 24. The NMOS transistor 22 comprises a metal gate electrode 26, an n-doped source electrode 28, an n-doped drain electrode 30, and an oxide layer 31. The PMOS transistor 24 comprises a metal gate electrode 32, a p-doped source electrode 34, a p-doped drain electrode 36, and an oxide layer 37. Both the NMOS transistor 22 and the PMOS transistor 24 are formed on a p-substrate 38.

The PMOS transistor 24 further comprises an n-well 40 disposed next to the p-substrate 38 for isolating the source electrode 34 and the drain electrode 36 of the PMOS transistor 24 from the p-substrate 38. The n-well 40 also serves as a current channel when the PMOS transistor 24 actuates.

For the NMOS transistor 22, if a voltage difference between the gate electrode 26 and the drain electrode 30 is greater than a predetermined threshold value, an external electric field appears and destroys the covalence bonds in molecules in the NMOS transistor 22. Because the oxide layer 31 contains a plurality of charges, if the external electric field changes, the number of electrons in the oxide layer 31 increases abruptly, making the oxide layer 31 breakdown and the NMOS transistor 22 invalid. Similarly, if a voltage difference between the gate electrode 32 and the drain electrode 36 of the PMOS transistor 24 is greater than a predetermined threshold value, another external electric field appears and destroys the covalence bonds in molecules in the PMOS transistor 24. Because the oxide layer 37 comprises a plurality of charges, if the external electric field changes, the PMOS transistor 24 will be also invalid.

Please refer to FIG. 3, which is a schematic diagram of a level shift circuit 50 according to a prior art. The level shift circuit 50 comprises two PMOS transistors 52, 56 and two NMOS transistors 54, 58. A gate electrode of the transistor 54 is connected to a voltage source Vdd. A source electrode of the transistor 52 and a source electrode of the transistor 56 are connected to a voltage source Vn. An input voltage Vin ranges between a voltage level of the voltage source Vdd (high voltage level) and that of ground (low voltage level, zero volts).

For example, if the voltage source Vn is 10 volts and the voltage source Vdd is 3.3 volts, the breakdown voltage level of each of the transistors 52, 54, 56, and 58 is 10 volts, and the input voltage Vin is at the high voltage level, the transistor 58 actuates and the transistor 54 does not actuate. Because the transistor 58 is actuated, the voltage level at a node B approaches zero, which actuates the transistor 52 and makes the voltage level at a node A approach 10 volts. The high voltage level at the node A will not actuate the transistor 56, so the output voltage Vout of the level shift circuit 50 approaches zero. Although the transistors 52, 58 are actuated, a reverse voltage across the drain electrodes and the gate electrodes of both the transistors 52, 58 approaches 10 volts, which results in a number of breakdown currents appearing in a corresponding oxide layer, destroying the level shift circuit 50.

On the other hand, if the input voltage Vin is at the low voltage level, the transistor 58 does not actuate and the transistor 54 actuates, which makes the voltage level at the node A approach zero. The low voltage level at the node A actuates the transistor 56. The actuated transistor 56 makes the voltage level at the node B approach 10 volts, which will not actuate the transistor 52 and consequently the output voltage of the level shift circuit 50 approaches 10 volts. Although the transistors 54, 56 are actuated, a reverse voltage across the drain electrodes and the gate electrodes of the transistors 54, 56 still approaches 10 volts, which results in a number of breakdown currents appearing in a corresponding oxide layer destroying the level shift circuit 50.

To prevent the transistors 52, 54, 56, and 58 from breaking down, the level shift circuit 50 has to control the voltage level of the voltage source Vn to guarantee that the four transistors 52, 54, 56, and 58 function normally.

As described previously, because the transistors 52, 54, 56, and 58 are conventional MOS transistors, that is, the transistors 52, 54, 56, and 58 have a low breakdown voltage resulting from a charge doping existing in the oxide layer, the transistors 52, 54, 56, and 58 are unstable when the voltage level of the voltage source Vn becomes high. Therefore, the prior art level shift circuit 50 is not capable of transferring a voltage with a low voltage level to a voltage with a very high voltage level.

SUMMARY OF INVENTION

It is therefore a primary objective of the claimed invention to provide a level shift circuit, whose breakdown voltage is high, to solve the above-mentioned problem.

According to the claimed invention, the level shift circuit includes at least a complementary metal oxide semiconductor (CMOS) transistor formed on a p-substrate. The CMOS transistor has a PMOS transistor and an NMOS transistor, which includes a gate electrode, a drain electrode having an n-well formed on the p-substrate and a first N-doped region formed inside the n-well, and a source electrode having a second N-doped region formed on the p-substrate.

It is an advantage of the claimed invention that level shift circuits provided with a claimed NMOS are capable of enduring a high breakdown voltage. Additionally, forming an n-well in an NMOS is not complicated and can be performed in an ordinary NMOS-manufacturing process.

These and other objectives of the claimed invention will no doubt become obvious to those of ordinary skill in the art after reading the following detailed description of the preferred embodiment that is illustrated in the various figures and drawings.

DETAILED DESCRIPTION

Figure 4:
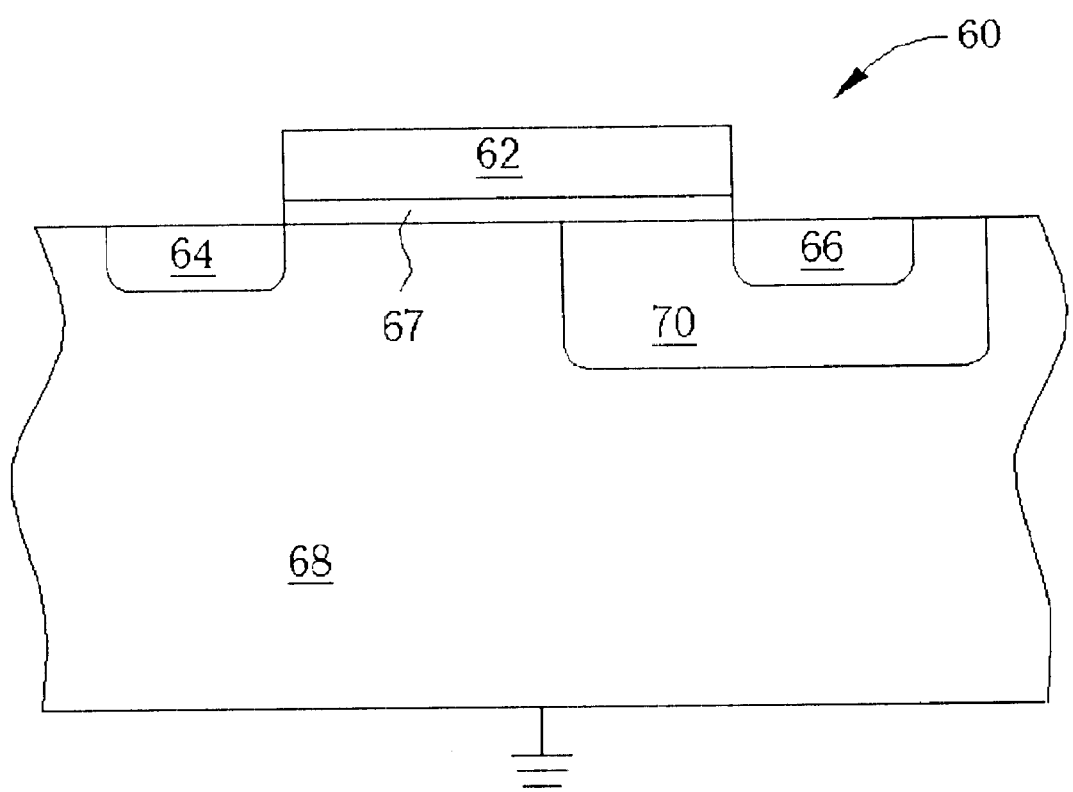
FIG. 4 is a schematic diagram of a structure of an N-type metal oxide semiconductor transistor according the present invention.

Please refer to FIG. 4, which is a schematic diagram of a structure of an N-type metal oxide semiconductor (NMOS) transistor 60 according to the present invention. The NMOS transistor 60 comprises a gate electrode 62 made of metal or polysilicon, an N-doped source electrode 64, an N-doped drain electrode 66, a P-type substrate 68, an oxide layer 67, and an n-well 70 formed between the drain electrode 66 and the P-type substrate 68 for isolating the drain electrode 66 from the substrate 68. The isolation prevents the transistor 60 from generating a p-n junction between the drain electrode 66 and the substrate 68. That is, the n-well 70 is used to increase a voltage level of a breakdown voltage between the drain electrode 66 and the substrate 68 to prevent a junction existing between the drain electrode 66 and the substrate 68 from breaking down.

Figure 5:
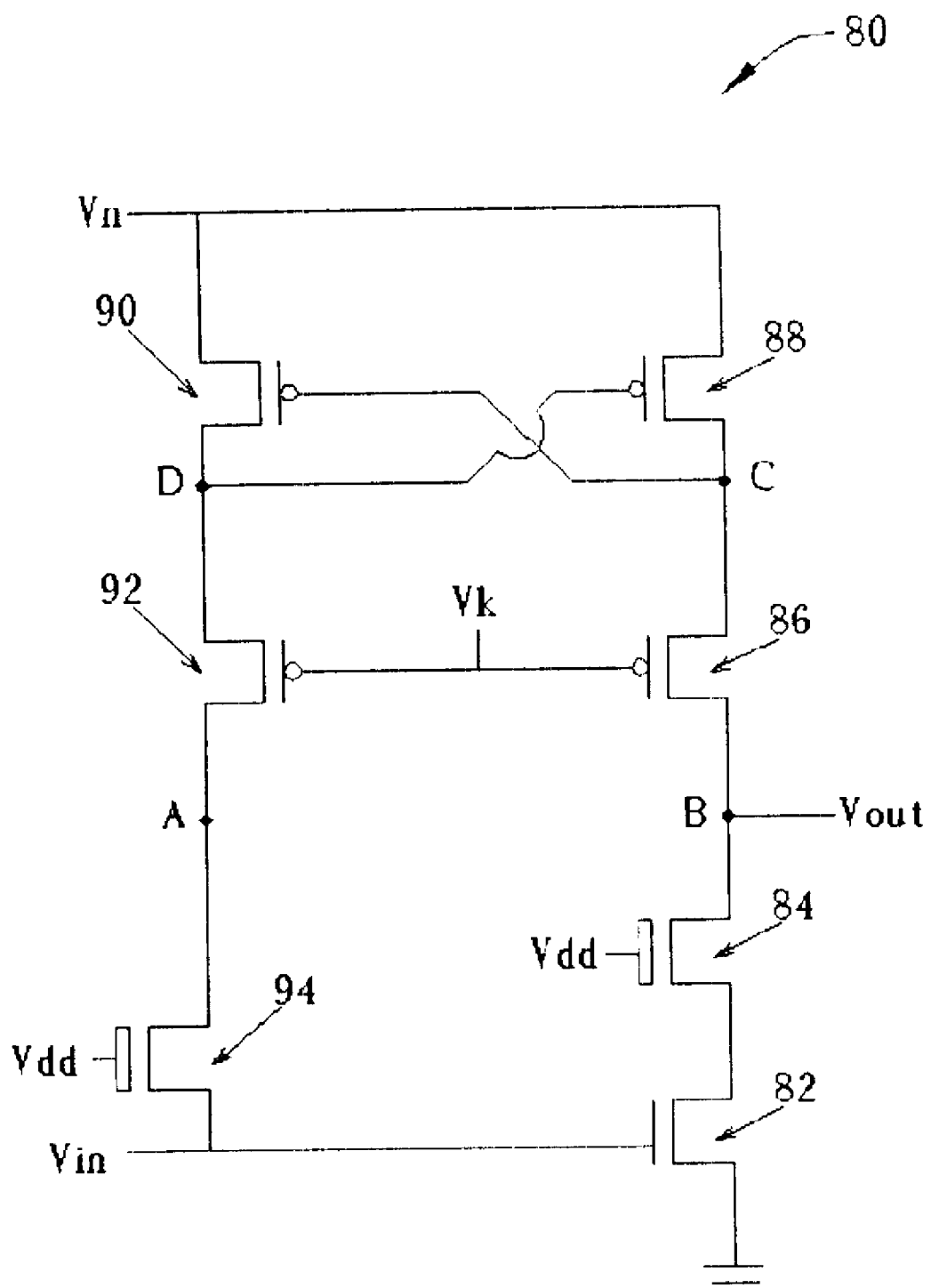
FIG. 5 is a schematic diagram of a first level shift circuit according to the present invention.

Please refer to FIG. 5, which is a schematic diagram of a first level shift circuit 80 according to the present invention. The circuit 80 comprises a plurality of PMOS transistors 86, 88, 90, and 92, and a plurality of NMOS transistors 82, 84, and 94. Please notice that the transistors 84, 94 have the same structure as that of the present invention NMOS transistor 60 shown in FIG. 4, but the transistor 82 is still a prior art NMOS transistor.

Source electrodes of the transistors 88, 90 are connected to a voltage source Vn. Gate electrodes of the transistors 88, 90 are respectively connected to drain electrodes of the transistors 90, 88. Gate electrodes of the transistors 86, 92 are connected to a reference voltage source Vk. Gate electrodes of the transistors 84, 94 are connected to another voltage source Vdd. The voltage level of an input voltage Vin ranges between a voltage level of the voltage source Vdd (high voltage level) and that of ground (low voltage level). Detailed descriptions of the level shift circuit 80 will be illustrated in the following paragraphs.

In this embodiment, the reference voltage source Vk is 3.3 volts, the voltage source Vn is 10 volts, and a breakdown voltage is 10 volts. If the input voltage Vin is 3.3 volts (that is, a voltage level of the voltage source Vdd, a high voltage level, is 3.3 volts), the transistor 94 does not actuate and the transistors 82, 84 actuate. The simultaneously actuated transistors 82, 84 make an output voltage at a node B approach zero. Because the gate electrodes of the transistors 86, 92 are connected to the reference voltage Vk (currently 3.3 volts), the transistors 86, 92 do not actuate, and thus a voltage level at a node C is not identical to that at the node B.

If a voltage level of the source electrode (the node C) is greater than a sum of a threshold voltage Vt of the transistor 86 and a voltage level of a gate electrode of the transistor 86, the transistor 86 actuates and then the transistor 90 also actuates, which makes a voltage level at a node D approach 10 volts (Vn). The actuated transistor 86 gradually reduces the voltage level at the node C until it is less than the sum of the threshold voltage Vt of the transistor 86 and the voltage level of the gate electrode of the transistor 86. Because a voltage level difference between the drain electrode and the gate electrode exceeds 6.6 volts, the transistor 90 will not break down. Likewise, the transistor 88 will not break down either. Because a voltage level at the node D approaches 10 volts, the transistor 92 will actuate and then a voltage level at a node A approaches 10 volts. As described above, this embodiment prevents the voltage level at the node C from being the same as that at the node B to make the transistors 88, 90 function normally (no breakdown occurs).

On the contrary, if the input voltage Vin is zero, the transistor 82 does not actuate and the transistor 94 actuates, which makes the voltage level at the node A approach zero volts. Because the gate electrodes of the transistors 86, 92 are connected to the reference voltage Vk (3.3 volts), both transistors 86, 92 do not actuate, which makes the voltage level at the node A and the voltage level at the node D different. When a voltage level of a source electrode (the node D) of the transistor 92 is greater than a sum of a threshold voltage Vt of the transistor 92 and a voltage level of the gate electrode of the transistor 92, the transistor 92 actuates. The voltage level at the node D approaches zero until the voltage level of the source electrode of the transistor 92 is less than the sum of the threshold voltage of the transistor 92 and the voltage level of the gate electrode of the transistor 92. The actuated transistor 92 actuates the transistor 88 and makes the voltage level at the node C approach 10 volts.

A voltage level difference between the drain electrode and the gate electrode is only 6.6 volts, so the transistor 88 will not break down. Likewise, the transistor 90 will not break down either. Because the voltage level at the node C approaches 10 volts, the transistor 86 actuates, which makes the voltage level at the node B approach 10 volts. As described above, this embodiment prevents the voltage level at the node D from being the same as that at the node A making the transistors 88, 90 function normally (no breakdown occurs). Additionally, for enduring high voltage levels at the node A and at the node B, the level shift circuit 80 has to use the NMOS transistor shown in FIG. 4 as the transistors 84 and the transistor 94.

Figure 6:
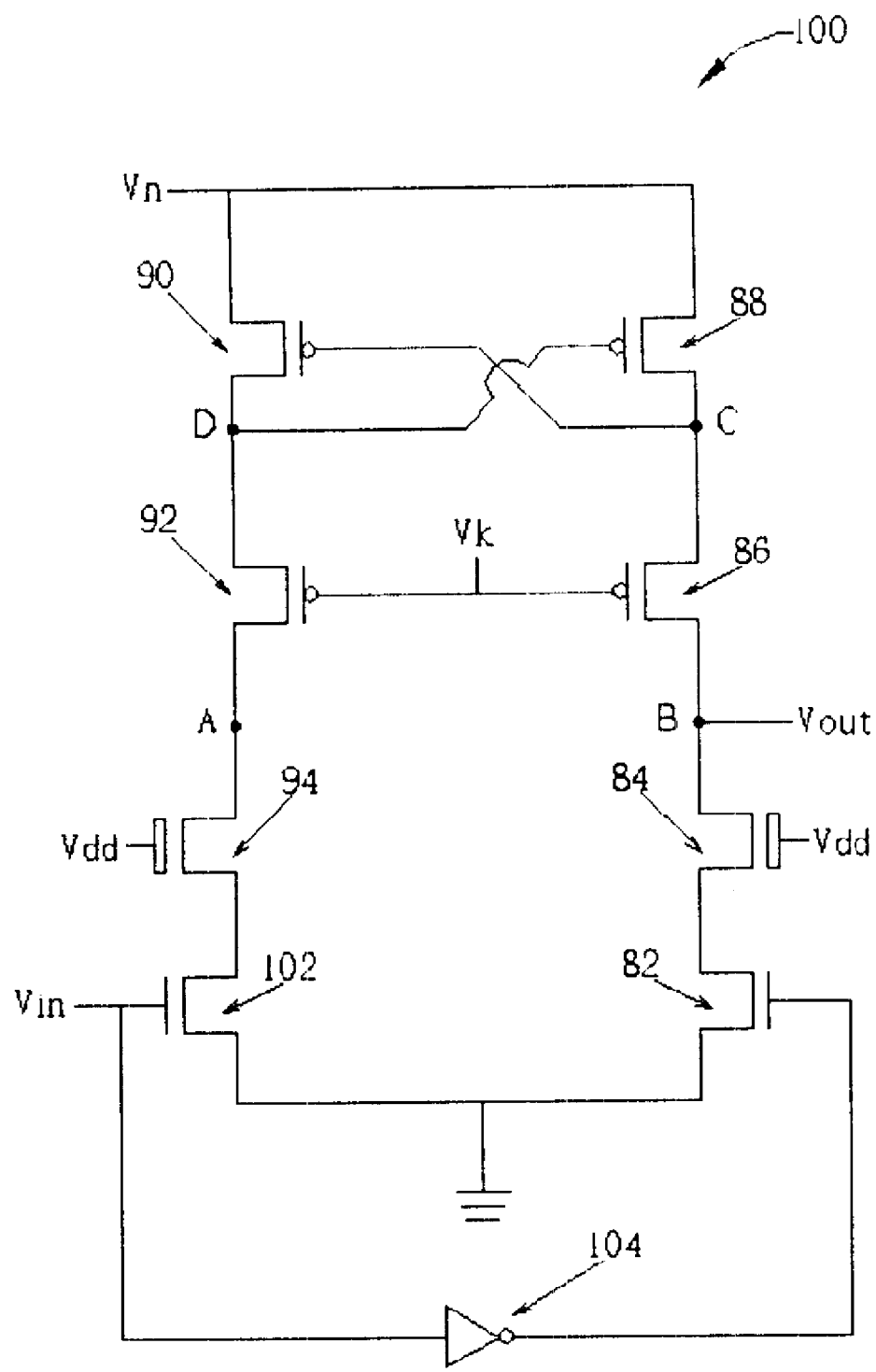
FIG. 6 is a schematic diagram of a second level shift circuit according to the present invention.

Please refer to FIG. 6, which is a schematic diagram of a second level shift circuit 100 according to the present invention. The circuit 100 comprises an inverter 104, a plurality of PMOS transistors 86, 88, 90, and 92, and a plurality of NMOS transistors 82, 84, 94, and 104. Please notice that the transistors 84, 94 have same structures as that of the present invention NMOS transistor 60 shown in FIG. 4, but the transistors 82, 102 are still prior art transistors.

Source electrodes of the transistors 88, 90 are connected to the voltage source Vn. Gate electrodes of the transistors 88, 90 are respectively connected to drain electrodes of the transistors 90, 88. Gate electrodes of the transistors 86, 92 are connected to the reference voltage Vk. Gate electrodes of the transistors 84, 94 are connected to the voltage source Vdd. The input voltage ranges between the voltage source Vdd and ground. The inverter 104 is connected between a gate electrode of the transistor 82 and a gate electrode of the transistor 102. Detailed descriptions of the level shift circuit 100 will be illustrated in the following paragraphs.

The reference voltage Vk is 3.3 volts, the voltage source Vn is 10 volts, an oxide layer breakdown voltage is 10 volts, and a p-n junction breakdown voltage is 10 volts. When the input voltage Vin is zero volts, the transistors 94, 102 do not actuate and the transistors 82, 84 actuate, which makes the voltage level at the node B approach zero. Because the gate electrode of the transistor 86 is connected to the reference voltage Vk, the transistor 86 does not actuate and the voltage level at the node C will not approach the voltage level at the node B (zero volts).

When a voltage level of the source electrode of the transistor 86 is greater than a sum of a voltage level of the threshold voltage Vt of the transistor 86 and that of the gate electrode of the transistor 86, the transistor 86 actuates until the voltage level of the source electrode of the transistor 86 is less than the sum of the voltage level of the threshold voltage Vt of the transistor 86 and that of the gate electrode of the transistor 86. The actuated transistor 86 actuates the transistor 90 and makes the voltage level at the node D approach 10 volts. A voltage level difference across the drain electrode and the gate electrode is only 6.6 volts, so the transistor 90 will not break down. Likewise, the transistor 88 will not break down either. Because the voltage level at the node D approaches 10 volts, the transistor 92 actuates, which makes the voltage level at the node A approach 10 volts. As described above, this embodiment effectively prevents the voltage level at the node C from being the same as that at node B making the transistors 88, 90 function normally (no breakdown occurs).

On the other hand, if the input voltage Vin is 3.3 volts, the transistor 82 does not actuate and the transistors 94, 102 actuate, which makes the voltage level at the node A approach zero volts. Because the gate electrodes of the transistors 86, 92 are connected to the reference voltage Vk (3.3 volts), both transistors 86, 92 do not actuate, which makes the voltage levels at the node A different from the voltage level at the node D. When a voltage level of a source electrode (node D) of the transistor 92 is greater than a sum of a threshold voltage Vt of the transistor 92 and a voltage level of the gate electrode of the transistor 92, the transistor 92 actuates and the voltage level at the node D approaches zero until the voltage level of the source electrode of the transistor 92 is less than the sum of the threshold voltage of the transistor 92 and the voltage level of the gate electrode of the transistor 92. The actuated transistor 92 actuates the transistor 88 and makes the voltage level at the node C approach 10 volts. A voltage level difference across the drain electrode and the gate electrode is only 6.6 volts, so the transistor 88 will not break down. Likewise, the transistor 90 will not break down either.

Because the voltage level at the node C approaches 10 volts, the transistor 86 actuates, which makes the voltage level at the node B also approach 10 volts. As described above, this embodiment effectively prevents the voltage level at the node D from being the same as that at node A to make the transistors 88, 90 function normally (no break down occurs). Additionally, for enduring high voltage levels at the node A and at the node B, the level shift circuit 80 has to use the present invention NMOS transistor shown in FIG. 4 as the transistors 84 and the transistor 94.

Figure 1:
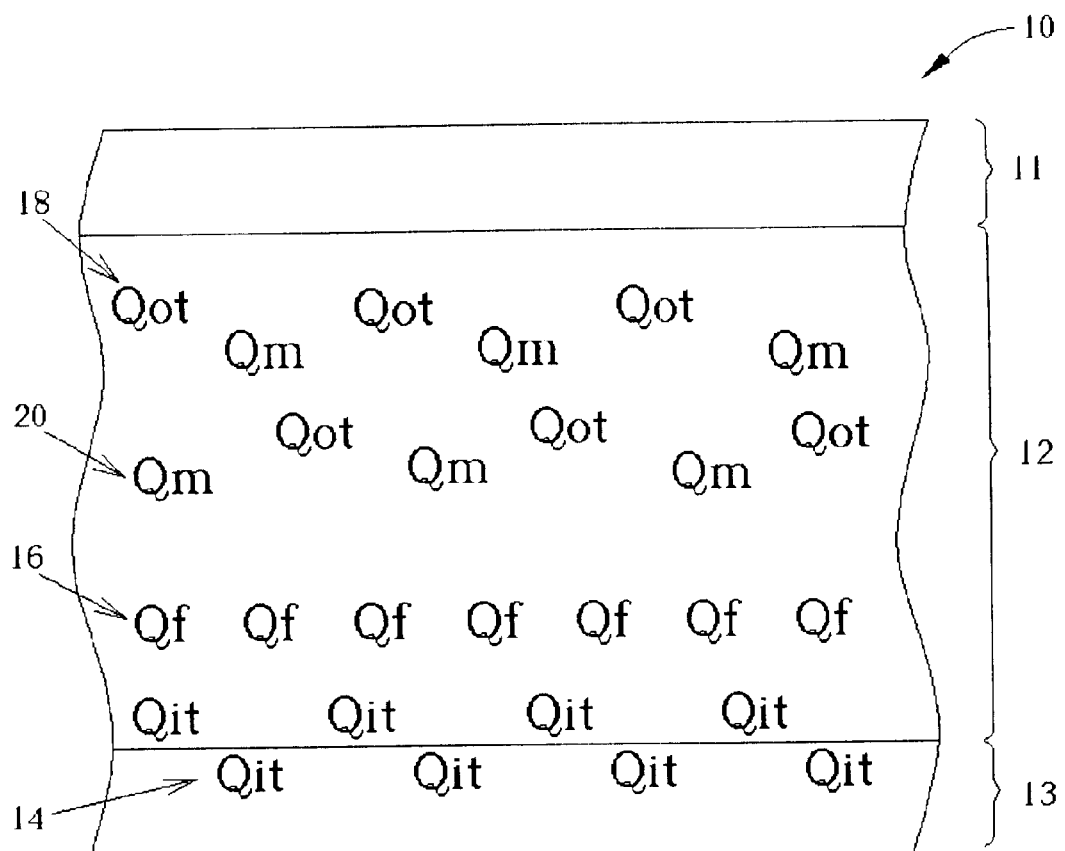
FIG. 1 is a schematic diagram of a charge disposition of a prior art MOS transistor.
Figure 2:
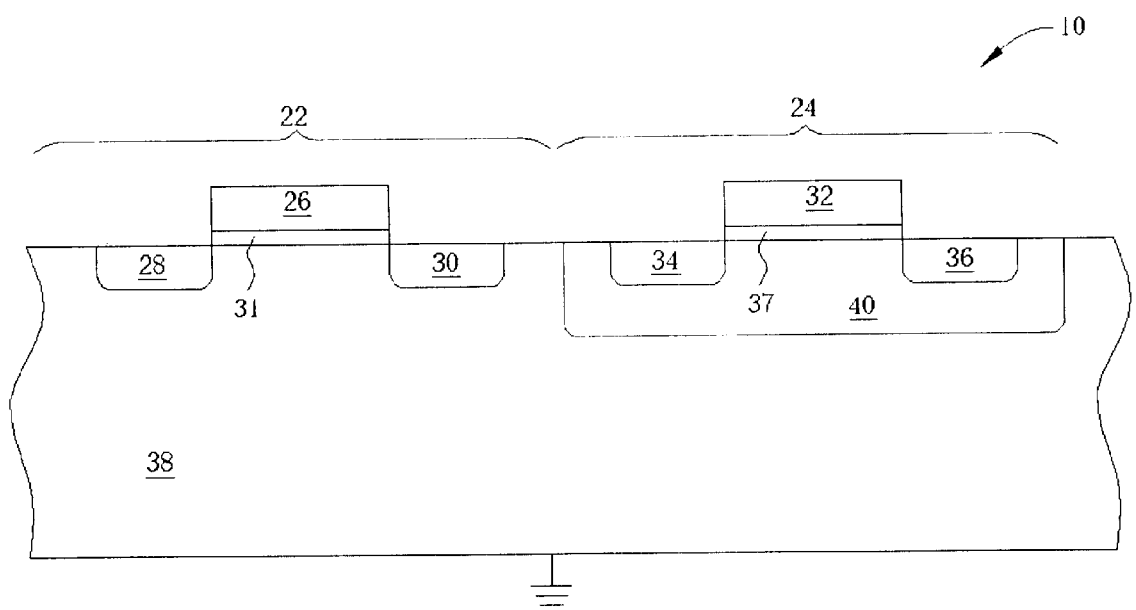
FIG. 2 is a schematic diagram of a structure of the MOS transistor shown in FIG. 1.
Figure 3:
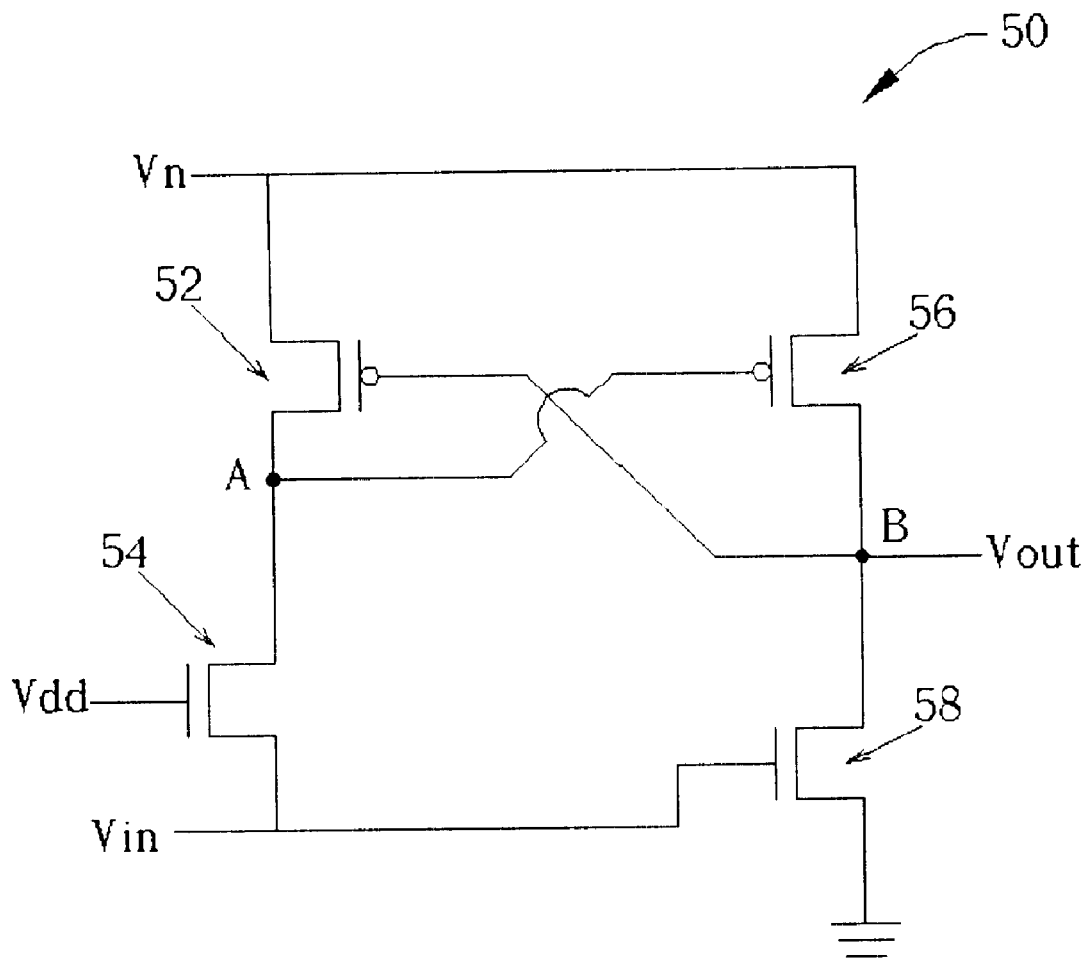
FIG. 3 is a schematic diagram of a prior art level shift circuit.

Please refer to FIG. 3, FIG. 5, and FIG. 6 again. Although the prior art level shift circuit 50 sometimes cannot transfer a low voltage to a high voltage due to a MOS transistor breakdown effect, the circuit 50 still can be used to serve as a first-stage circuit. In other words, serving as a second-stage circuit, the level shift circuit 80 or the level shift circuit 100 transfers the output voltage of the circuit 50 (the first-stage circuit) to the output voltage of the circuit 80 or of the circuit 100. For example, if the high level voltage of the input voltage is 3.3 volts, the low level voltage of the input voltage is zero volts, and the voltage source Vn level is five volts, the output voltage level is either five volts or zero volts and a voltage level difference across the drain electrode and the gate electrode is less than the breakdown voltage level (no break down occurs). Thus, the output end of the circuit 50 can be connected to the input end of the circuit 80 or to the input end of the circuit 100. Please notice that the voltage source Vdd of the second-stage circuit becomes five volts, which allows the output voltage level of circuit 80 or of the circuit 100 attain 10 volts (no break down occurs).

In contrast to the prior art, the level shift circuits 80, 100 use the reference voltage Vk to control actuations of the transistors 86, 92, which is capable of preventing the gate electrodes of the transistors 88, 90 from breaking down. As shown in FIG. 4, the NMOS, provided with an extra n-well, endures a high voltage level difference across the drain electrode and the substrate of the NMOS. That is, the NMOS of the present invention has a high breakdown voltage. Additionally, forming an n-well in an NMOS is not complicated and can be performed in an ordinary NMOS-manufacturing process.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A level shift circuit for shifting an input voltage to an output voltage comprising:

a first complementary metal oxide semiconductor (CMOS) transistor formed on a first p-substrate for providing a reference, the first CMOS transistor having a first PMOS transistor and a first NMOS transistor;

a second CMOS transistor formed on a second p-substrate for providing a reference, the second CMOS transistor having a second PMOS transistor and a second NMOS transistor, a gate electrode of the first PMOS of the first CMOS being connected to a gate electrode of the second PMOS of the second CMOS;

a third PMOS and a fourth PMOS, a source electrode of the third PMOS and a source electrode of the fourth PMOS being connected to a power supply, a gate electrode of the third PMOS being connected to a source electrode of the second PMOS of the second CMOS, a gate electrode of the fourth PMOS being connected to a source electrode of the first PMOS of the first CMOS, a drain electrode of the third PMOS being connected to a source electrode of the first PMOS of the first CMOS, a drain electrode of the fourth PMOS being connected to a source electrode of the second PMOS of the second CMOS; and a third NMOS having a drain electrode, being connected to the second source electrode of the second NMOS of the second CMOS, a gate electrode being connected to the first source electrode of the first NMOS of the first CMOS, and a source electrode being grounded.

2. The level shift circuit of claim 1 further comprising an input end connected to the gate electrode of the third NMOS for inputting the input voltage so as to control conductivity of the third NMOS.

3. The level shift circuit of claim 2 wherein the gate electrode of the first NMOS of the first CMOS and the gate electrode of the second NMOS of the second CMOS are connected to a control voltage, and the control voltage and the input voltage are used to control conductivity of the first NMOS of the first CMOS and conductivity of the second NMOS of the second CMOS.

4. The level shift circuit of claim 3 wherein when the first NMOS of the first CMOS is conducting, the second NMOS of the second CMOS and the third MMOS are not conducting, and when the second NMOS of the second CMOS and the third NMOS are conducting, the first NMOS of the first CMOS is not conducting.

* * * * *